Figure 1A:
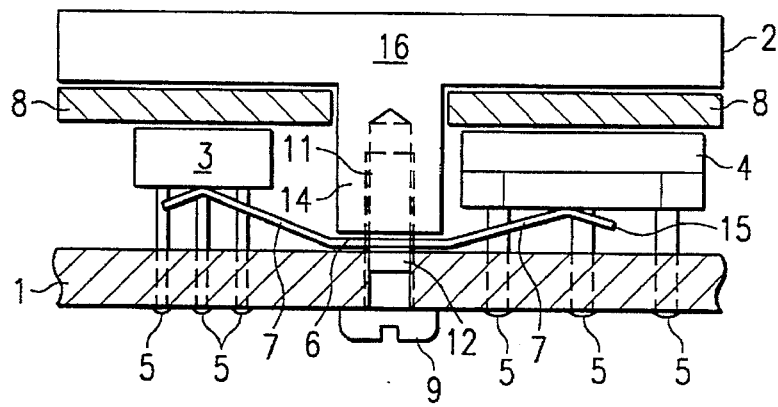

United States Patent [19]
Bosli

[11] Patent Number: 5,648,889
[45] Date of Patent: Jul. 15, 1997

[54] ATTACHMENT DEVICE FOR SEMICONDUCTOR CIRCUIT ELEMENTS

[75] Inventor: Hans Ludwig Bosli, Schwerzenbach, Switzerland

[73] Assignee: Melcher, AG, Uster, Switzerland

[21] Appl. No.: 379,666

[22] PCT Filed: Apr. 18, 1994

[86] PCT No.: PCT/CH94/00076

§ 371 Date: Sep. 15, 1995

§ 102(e) Date: Sep. 15, 1995

[87] PCT Pub. No.: WO94/29901

PCT Pub. Date: Dec. 22, 1994

[30] Foreign Application Priority Data

Jun. 7, 1993 [CH] Switzerland .................. 1698/93

[51] Int. Cl.$^6$ .................................................. H05K 7/20
[52] U.S. Cl. .................. 361/704; 257/717; 257/719; 361/719
[58] Field of Search .......................... 361/688–690, 361/702–711, 713, 717–719, 807, 810; 257/706, 707, 712, 713, 717–719, 723, 724, 726, 727; 174/16, 3; 165/80.3, 185

[56] References Cited

U.S. PATENT DOCUMENTS

| | | | |
|---|---|---|---|
| 3,946,276 | 3/1976 | Braun | 361/704 |
| 4,321,423 | 3/1982 | Johnson | 174/16.3 |
| 4,923,179 | 5/1990 | Mikolajczak | 267/160 |
| 5,155,649 | 10/1992 | Hung | 361/119 |
| 5,321,582 | 6/1994 | Casperson | 361/713 |

FOREIGN PATENT DOCUMENTS

| | | |
|---|---|---|
| 2419659 | 10/1979 | France . |
| 8510248 | 9/1985 | Germany . |
| 8627860 | 2/1987 | Germany . |

OTHER PUBLICATIONS

Electronics, Kirby, Feb. 1984, pp. 149–151, "Flexible Circuits . . . Mounting".

"Movable . . . Clamp", IBM Tech Discl Bull vol. 27 #2 pp. 1140–1142, Jul. 1984.

*Primary Examiner*—Gerald P. Tolin
*Attorney, Agent, or Firm*—Jenkens & Gilchrist, a Professional Corporation

[57] ABSTRACT

The inventive device basically consists of a T-shaped cooling element (2), divided into a rib (14) and a crossplate (16), with said device secured to the circuit board (1) by means of screws (9). The base plate (6) of a spring element (15) is inserted between the rib (14) of the cooling element (2) and the circuit board (1). This base plate (6) is equipped with at least one spring tab (7) on each side. The rib (14) is equipped with threaded openings (11) that are flush with the openings in the base plate (6). The base plate (6) is equipped with an angled tab (12) at each end that is adjusted to the corresponding opening in the circuit board (1) for precise positioning of the base plate (6). The semiconductors (3, 4) that are to be attached and that are soldered to electrical connectors (5) are pressed against the surface of the crossplate (16) facing the circuit board by means of the spring tabs (7). Depending on the potential position of the semiconductor (3, 4) or the design of its housing, an insulation platelet (8) is inserted in between the semiconductor (3, 4) and the crossplate (16).

11 Claims, 3 Drawing Sheets

ATTACHMENT DEVICE FOR SEMICONDUCTOR CIRCUIT ELEMENTS

The present invention relates to a device used for the attachment of semiconductor control and circuit elements, such as transistors, thyristors, triacs, etc., designed for the dissipation of heat loss according to the collective term of patent claim 1.

Such devices are rather conventional. They might consist of cooling elements with different designs onto which the semiconductor control and circuit elements (hereafter referred to as semiconductors) are attached by means of screws. Therefore, many semiconductors have an attachment opening in their housing or in a cooling tab protruding from the housing.

We are also familiar with devices consisting of a spring element that presses the semiconductor against the cooling element. This spring element can be attached by snapping it into suitable openings in the cooling element.

These conventional devices have characteristics that may become disadvantageous in case the height of the electronic components, which are usually mounted on a circuit board, is limited. This is often the case, since the standardization of assembly carriers, multipoint connectors and the corresponding distances in electronic components limits the lateral distances between the circuit boards to remain within a predetermined grid. Moreover, economic reasons suggest the attachment of circuit boards as closely together as possible, as is permissible for the dissipation of heat loss.

Many of the conventional devices have a tall structure that is disadvantageous for the reasons given above. If the semiconductors are to be attached to the cooling element by screws, additional insulation components will be necessary, depending on the potential position of the semiconductor housing or the cooling tab. In order to ensure the heat contact between semiconductor and cooling element at all temperatures, additional elastic elements, such as spring washers, will become necessary.

We are familiar with attachment devices in the form of springs. While these springs meet the requirements concerning ease of installation and maintaining the heat contact, they are usually designed for only one particular kind of semiconductor housing and require a relatively large amount of space on the circuit board due to their tall design.

The purpose of this invention is the development of a device for the secure attachment of semiconductors with the necessary pressure that will be low in profile and responsible for a good heat contact between semiconductor and cooling element. It will be suitable for a number of different housing designs and allow for simple mounting while meeting all the necessary insulation requirements. Moreover, the flow of force required for securing the semiconductors is not to have an effect on the circuit board.

The solution to this problem is represented in the characterizing part of patent claim 1.

Figure 1B:
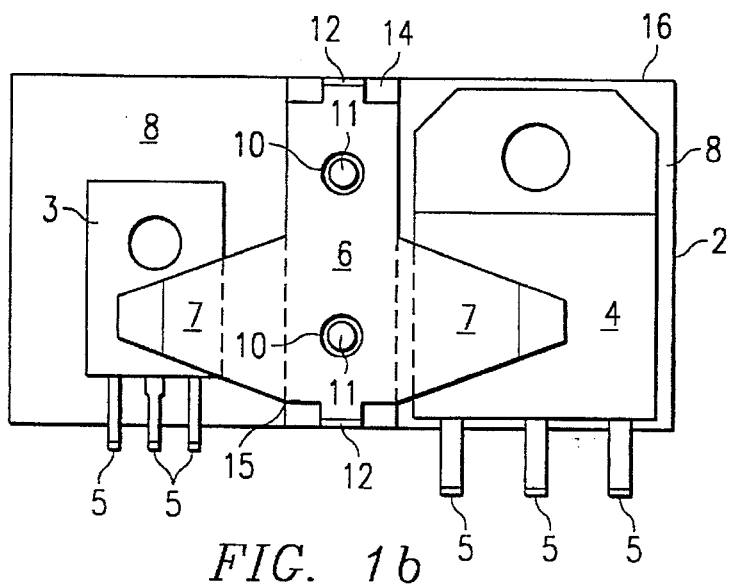
Figure 1C:
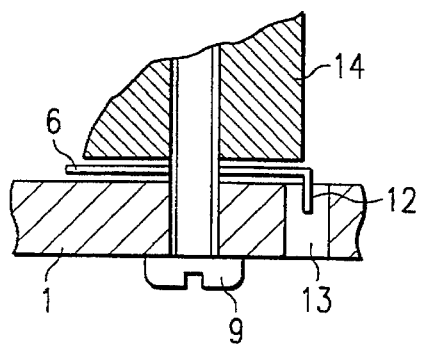
Figure 6:
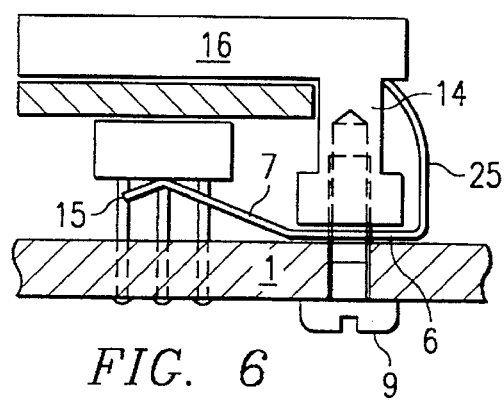
Figure 2:
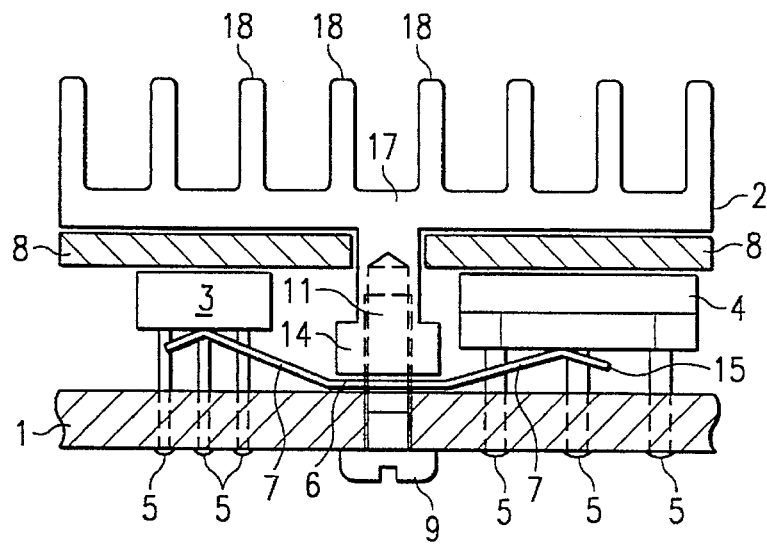
Figure 3:
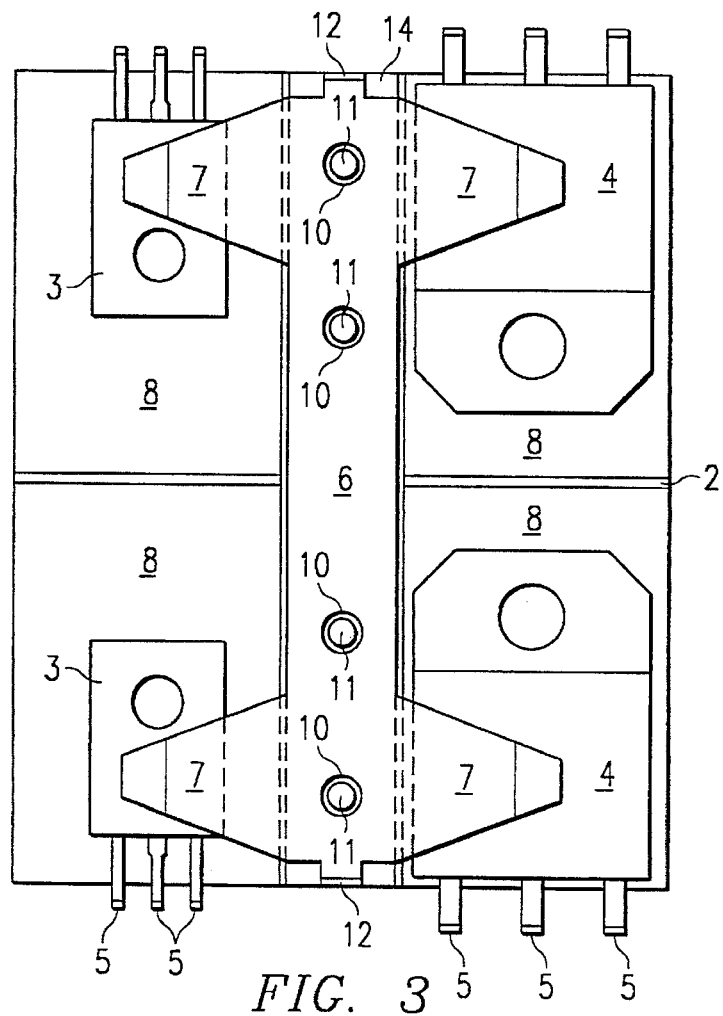
Figure 4:
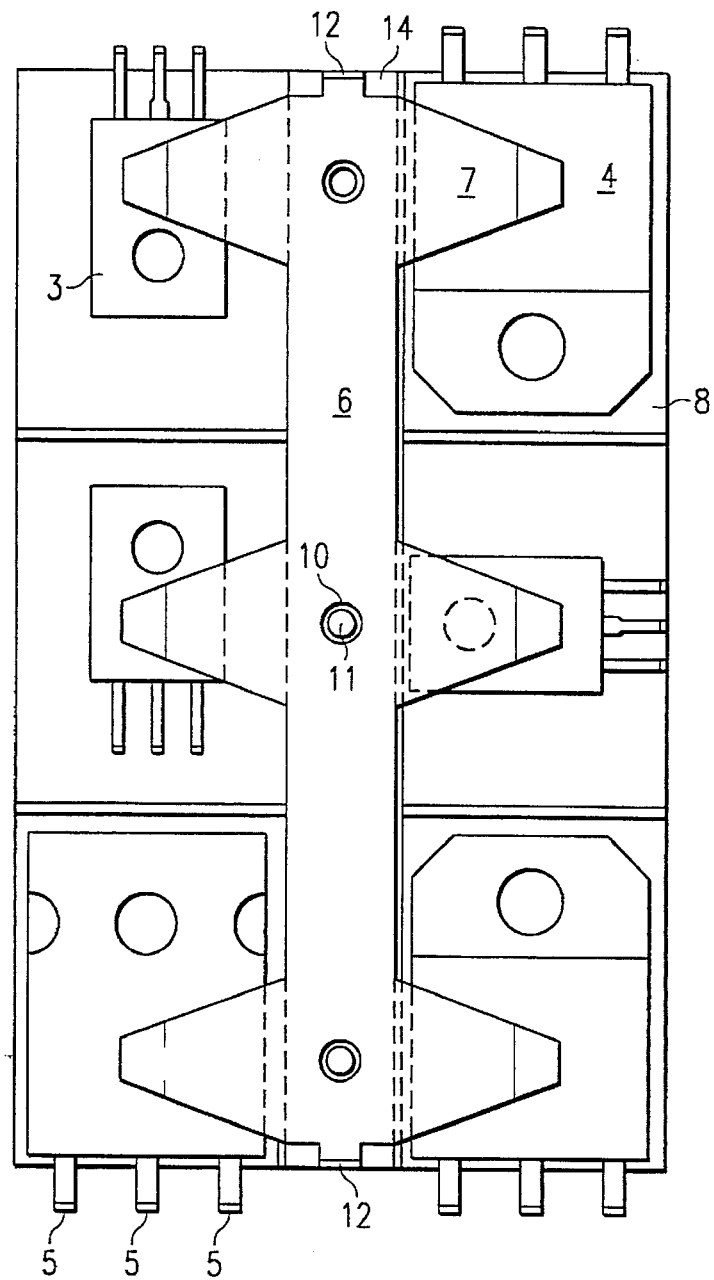
Figure 5A:
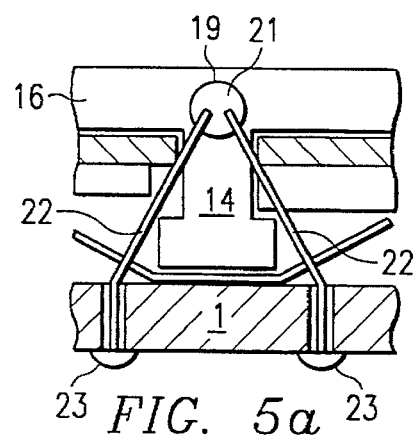
Figure 5B:
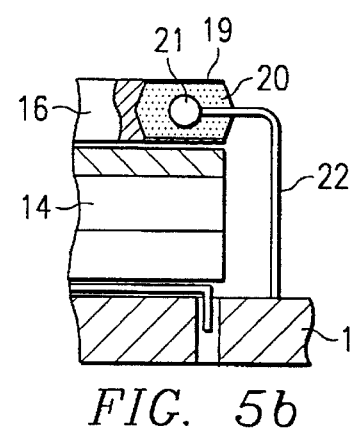

The enclosed figures further illustrate the invention. They show:

FIGS. 1a, b a first design example in two views,

FIG. 1c a detail of the first design example,

FIG. 2 an additional design version of a cooling element according to this invention, FIG. 3 a first variation of FIG. 1a, b, FIG. 4 a second variation of FIG. 1a, b, FIGS. 5a, b an additional design version of a device according to this invention, FIG. 6 a second design example.

FIG. 1a is the lateral view of an attachment device according to this invention in the direction of the circuit board 1 that is shown in profile. FIG. 1b is the same device in a plan view as seen from the circuit board. A cooling element 2, resembling a T-shape in its cross-section, with a rib 14 is attached to the circuit board 1 by means of two screws 9. The cooling element 2 has two threaded openings 11 in the rib 14. The more or less rectangular base plate 6 of a spring element 15 is inserted in between the circuit board 1 and the rib 14 of the cooling element 2. This base plate has two openings 10 that are flush with the threaded openings 11. The fastening of the cooling element 2 to the circuit board 1 by means of the screws 9 will also result in a fastening of the base plate 6. The narrow sides of the base plate 6 are equipped with a tab 12 angled against the circuit board 1. FIG. 1c clearly illustrates that each of these tabs 12 protrudes into an opening 13 on the circuit board 1. These openings 13 allow for the precise positioning of the spring element 15.

The base plate 6 of the spring element 15 is also equipped with two lateral spring tabs 7 that—due to their bend shape and preload—each press a semiconductor 3, 4 against the cooling element 2. An insulating component, such as a platelet 8 of aluminum oxide or an electrically insulating but heat-conductive foil, is placed between the semiconductors 3, 4 and the cooling element 2 for insulation purposes. FIG. 1b illustrates this arrangement as viewed from the circuit board 1, seen from above with regard to FIG. 1a. FIG. 1c is a detailed sectional view, as seen from the left with regard to FIG. 1a. The number 5 refers to the electrical connectors of the semiconductors 3, 4. FIGS. 1a, b, c illustrate semiconductors differing greatly in size, such as the housing types TO 126 and TO 218.

The shape of the cooling element 2 in this particular design is advantageous in so far as it dissipates the heat from the semiconductors 3, 4 over a wide surface and by means of a short dissipation path directly to the cooling element 2 or its crossplate 16, bypassing the rib 14 and, therefore, the circuit board 1.

FIG. 2 illustrates a second design version of the cooling element 2. The crossplate 16 in FIG. 1a is replaced by a finplate 17 equipped with several cooling fins 18. This design of the cooling element 2 is especially useful for semiconductors on freestanding circuit boards, while the design version according to FIG. 1a is useful for designs in which the circuit board 1 with its mounted circuit elements is installed into a housing, or if a cover or heat dissipation plate is mounted on several cooling elements designed according to this invention. This will allow for the crossplate 16 to establish a heat contact with the housing or the cover plate and, thus, dissipate the heat loss to the surrounding air.

The illustration of the design example according to FIG. 3 corresponds with the one in FIG. 1b. The cooling element 2 in this version is large enough to allow for the attachment of four semiconductors 3, 4. In order to comply with the enlargement in regard to the first design version, this spring element 15 is equipped with four spring tabs 7 each pressing a semiconductor 3, 4 against an insulation platelet 8 and, therefore, against the bottom side of the crossplate 16 or the finplate 17. The semiconductors 3, 4 shown in this drawing are only an example. They can be replaced by any semiconductor with a flat surface. The number of electrical connectors 5 is also irrelevant for this invention. Due to the extension of the base plate 6, the number of openings 10 is increased to four. This number, too, is only a guideline; the dimensions of the attachment device may necessitate five openings or this requirement could be met by only two openings.

FIG. 4 is another illustration of a variation on FIG. 1: here, six semiconductors are mounted on the cooling element 2, which has been extended appropriately. The number of spring tabs 7 on the spring element 15 was also increased to six. The other design features remain the same as in FIG. 3.

FIGS. 5a, b is another design version of the attachment device. In the two detail views, which correspond to FIGS.

1a, c, the crossplate 16 is equipped with a blind bore 19 above the rib 14. This bore might house might, for example, by means of a sealing compound 20 allowing for a good heat contact, house a temperature probe 21 that is soldered to the corresponding contacts 23 on the circuit board 1 by means of conductors 22. This allows the constant electrical monitoring of the cooling element 2. The crossplate 16 can be replaced by a finplate 17 according to FIG. 2. It is also possible to attach a temperature probe 21 at each end of a crossplate 16 or a finplate 17, particularly when these components have the dimensions of those in FIG. 3. This allows for the monitoring of dissimilar power losses from semiconductors 3, 4.

The design of the rib 14 in FIGS. 5a, b is slightly different than that in FIG. 1. It has a wider base on the circuit board, while the part resting against the crossplate 16 or the finplate 17 is narrower than that in FIG. 1. This increases the lateral insulation path from the semiconductors 3, 4 to the rib 14, while the heat flow to the circuit board 1 can be reduced.

The distance between the crossplate 16 and the circuit board 1 can be varied with the design by using ribs 14 of different heights or inserting spacers (not shown) between the circuit board 1 and the rib base 14. Thus, the space between the semiconductors 3, 4 and the circuit board 1 can be used completely for conducting paths and—in case of sufficient space—for electronic components.

FIG. 6 illustrates another design version of the attachment device according to this invention. In this case, the cooling element 2 is not in a T-shape, but extends only to one side. However, this one-sided design can offer space for more semiconductors. In order to relieve the flow of pressing forces from the circuit board 1, the spring element 15 is equipped with a spring spur 25 on the side facing away from the spring tab 7 that becomes effective at the site where the rib 14 unites with the crossplate 16. This enables the spring tab 7 to have the same spring characteristics as the ones used in the other design versions.

The spring tab 7 does not have to be of a trapezoid design to meet the requirements of this invention. The inventive idea incorporates spring tabs 7 with different shapes and bending characteristics. The same is true for the part of the spring tab 7 that presses on the semiconductor 3, 4. It can be shaped in such a way that the force is distributed over a surface instead of being exerted in a linear manner on the semiconductor 3, 4 that is to be attached.

I claim:

1. A device for the attachment of semiconductor control and circuit elements (hereafter: semiconductor (3, 4)) and for the dissipation of their heat loss for the assembly on circuit boards (1), said device comprised of a cooling element (2) and a spring element (15) pressing the semiconductors (3, 4) to the cooling element wherein said cooling element (2) consists of a rib (14) perpendicular to the circuit board (1) with said rib supporting a crossplate (16) arranged in a perpendicular manner to said and parallel to said circuit board (1), wherein said rib (14) of the cooling element (2) is equipped with threaded openings (11) for the installation of screws (9) which secure the rib (14) to the circuit board (1), wherein a spring element (15) is present consisting of a base plate (6) and spring tabs (7) extending from this plate, wherein said base plate (6) of the spring element (15) is inserted in between the circuit board (1) and the rib (14) and fastened by said screws (9), for this purpose the base plate (6) is equipped with openings (10) that are flush with the threaded openings (11), wherein said spring tabs (7) have a shape and preload that presses against the surface of the crossplate (16) facing the circuit board side, wherein the surface of said crossplate (16) facing the circuit board is flat and of such a size that a semiconductor (4) of the housing type TO 247 can be inserted between the surface of the crossplate (16) facing the circuit board and the spring tab (7) without overlapping on either side, wherein an electrical insulation element with good heat conductivity in form of a platelet (8) is present that is inserted between the surface of the crossplate (16) facing the circuit board and the semiconductor (3, 4) and is fastened together with said semiconductor by means of said spring tabs (7), wherein said base plate (6) has an angled tab (12) on each side that will each fit in an opening (13) on the circuit board (1) and ensure the precise positioning of the base plate.

2. The device according to claim 1 wherein said crossplate (16) is symmetrical to said rib (14), and extends on both sides of said rib (14) for the same length, wherein said spring tabs (7) are present on both sides and symmetrical to said base plate (6) of said spring element (15).

3. The device according to claim 2 wherein said base plate (6) of said spring element (15) has two sides that are equipped with one spring tab (7) each.

4. The device according to claim 2 wherein said base plate (6) of said spring element (15) is equipped with more than one said spring tab (7) on each side.

5. The device according to claim 1 wherein said crossplate (16) is asymmetric to said rib (14), with said crossplate being much shorter on one side than on that side which will support said semiconductors (3, 4), wherein said spring tabs (7) are only present on one side of said base plate (6), wherein a spring spur (25) is present on that side of the base plate (6) opposite the spring tab (7), and said spur being shaped in such a way that it engages at that site on the cooling element (2) where the shorter part of the crossplate (16) merges with said rib (14).

6. The device according to claim 5 wherein said base plate (6) is equipped with said spring tab (7) and said spring spur (25).

7. The device according to claim 5 wherein said base plate (6) is equipped with more than one said spring tab (7) and more than one said spring spur (25).

8. The device according to claim 1 wherein said rib (14) is tall enough that a space remains between said circuit board (1) and said semiconductors (3, 4) attached to said crossplate (16), allowing for additional circuit components being attached to said circuit board (1).

9. The device according to claim 1 wherein the surface of the crossplate (16) facing away from said circuit board (1) is flat.

10. The device according to claim 1 wherein said surface of the crossplate (16) facing away from the circuit board (1) has a fin-like structure.

11. The device according to claim 1 wherein said cooling element has at least one blind bore (19) parallel to said rib (14) that will house a temperature probe (21).

* * * * *